(12) United States Patent
Yamaguchi

(10) Patent No.: US 6,271,531 B1
(45) Date of Patent: Aug. 7, 2001

(54) CHARGED BEAM DRAWING APPARATUS AND METHOD THEREOF

(75) Inventor: Toshiya Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/363,886

(22) Filed: Jul. 30, 1999

(30) Foreign Application Priority Data

Aug. 5, 1998 (JP) .................................................. 10-221659

(51) Int. Cl.$^7$ .................................................. H01J 37/302
(52) U.S. Cl. ...................................... 250/492.22; 250/398
(58) Field of Search ........................ 250/492.22, 492.23, 250/398, 492.2

(56) References Cited

U.S. PATENT DOCUMENTS 5,841,145 * 11/1998 Satoh et al. ...................... 250/492.22

FOREIGN PATENT DOCUMENTS 8-51052   2/1996  (JP) .
8-321462  12/1996 (JP) .

\* cited by examiner

Primary Examiner—Kiet T. Nguyen
(74) Attorney, Agent, or Firm—McGinn & Gibb, PLLC

(57) ABSTRACT

A wafer with a surface on which a to-be-exposed resist is applied is first placed in a predetermined position. The position of the wafer and an irradiation position of en electron beam to be irradiated for exposing the resist are both aligned. Next, a chip area is exposed by irradiating the electron beam onto the chip area of the wafer in which to-be-manufactured chips are formed. Now, a peripheral area, which is positioned at the periphery of the chip area and in which incomplete chips not to be manufactured are formed, is exposed with the electron beam while setting accuracy of the irradiation position of the electron beam and an exposure amount thereof lower and smaller than accuracy of the irradiation position and an exposure amount thereof when exposing the chip area. After the exposure, the wafer onto which the electron beam has been irradiated is removed from the predetermined position.

20 Claims, 11 Drawing Sheets

CHARGED BEAM DRAWING APPARATUS AND METHOD THEREOF

BACKGROUND OF THE INVENTION

1. Field of the Invention

The present invention relates to a charged beam drawing apparatus and method thereof.

2. Description of the Related Art

In recent years, as semiconductor devices are complicatedly structured, a charged particle beam (for example, an electron beam) has been used to expose a resist which is applied on a wafer.

When a wafer is divided into a plurality of pieces in a chip size, the surface of the wafer includes a chip area in which to-be-manufactured chips (device chip) are formed and a peripheral area in which peripheral chips (not to be manufactured owing to their incompleteness of the form) are formed.

An area of a single peripheral chip is smaller than that of a device chip. Therefore, if an electron beam is irradiated onto the peripheral area based on the same exposure data as the chip area, the electron beam may possibly be irradiated onto a wafer holder for holding the wafer.

If the electron beam is irradiated onto the wafer holder, oil mist composed of a very small amount of organic matter is printed on a wafer holder, then an insulating film is formed on the wafer holder. Such insulating film is charged up when irradiating the electron beam onto the following wafer, particularly when exposing the peripheral area. Charging up the insulating film brings about drift of the electron beam. Once the irradiation position of the electron beams is drifted, an irradiation position of the electron beam deviates from its appropriate position. Then, the exposure area of the resist also deviates from an appropriate position, resulting in the resist being patterned inaccurately.

Disclosed in Unexamined Japanese Patent Application KOKAI Publication No. H8-51052 is a technique for overcoming the above-described problems. According to the technique disclosed in Unexamined Japanese Patent Application KOKAI Publication No. H8-51052, peripheral chips are divided into a plurality of smallest areas onto which the electron beam can still be irradiated, when exposing a peripheral area. The electron beam is controlled not to be irradiated onto the wafer holder and to expose only the peripheral chips. In the exposure of the peripheral area, a positive type resist is applied on the wafer, and the electron beams is irradiated onto the entire peripheral area, so as to remove the resists from the peripheral area.

However, in the technique disclosed in Unexamined Japanese Patent Application KOKAI Publication No. H8-51052, there is found such a problem as shown below.

Since the peripheral chips formed in the peripheral area can not be manufactured, a degree of accuracy of the irradiation position and exposure amount when exposing the peripheral area may be lower than a degree thereof when exposing the chip area.

However, according to the above-described technique, the peripheral chips are only divided into a plurality of small areas in order to irradiate the electron beam onto the peripheral chips rather than the onto the wafer holder. Thus, a problematic matter arises in that the electric power is wastefully consumed, and that the throughput of to-be-manufactured semiconductor devices is low.

If the resist on the peripheral area is removed as described above, the side wall of the resist formed in the chip area is exposed. Thus, the side wall of the resist formed in the chip area may be etched, in the etching performed after the resist is removed from the peripheral area.

If the side wall of the resist formed in the chip area is unnecessarily etched as described above, low yield of to-be-manufactured semiconductor devices may problematically be realized.

SUMMARY OF THE INVENTION

Accordingly, an object of the present invention is to provide a charged beam drawing apparatus which is operable at low consumption power.

Another object of the present invention is to provide a charged beam drawing method capable of realizing high throughput of to-be-manufactured semiconductor devices.

Further object thereof is to provide a charged beam drawing method capable of realizing high yield of to-be-manufactured semiconductor devices.

In order to achieve the above-described objects, according to the first aspect of the present invention, there is provided a charged beam drawing apparatus comprising:

a particle source which outputs a charged beam to be irradiated onto a wafer having a surface on which a to-be-exposed resist is applied;

predetermined number of masks each of which has an aperture through which the charged beam can pass;

at least one lens which changes a forward direction of the charged beam and changes a degree of convergence of the charged beam; and a controller which irradiates the charged beam onto the wafer with predetermined accuracy of an irradiation position of the charged beam and at a predetermined exposure amount, by controlling at least either one of the particle source, the masks, or of the lens, and wherein the controller irradiates the charged beam onto a peripheral area of the wafer while setting the accuracy of the irradiation position of the charged beam lower, when exposing the peripheral area which is positioned at the periphery of a chip area including to-be-manufactured device chips and in which incomplete peripheral chips not to be manufactured are formed, than the accuracy of the irradiation position thereof when exposing the chip area of the wafer.

According to the present invention, an exposure time for exposing the resist applied on the wafer can be shorter than an exposure time for exposing the resist according to the conventional techniques. For example, in a case where stabilizing operations of the lens (an electromagnetic lens) is quite time consuming, it is required to wait until the lens becomes stable at every shot, for exposing the chip area with high accuracy. It is not required to expose the peripheral area with the same accuracy as the chip area, thus the shorter exposure time can be realized by setting the accuracy of the irradiation position of the charged beam lower.

The controller may irradiate the charged beam onto the peripheral area at the exposure amount which is smaller than the exposure amount when exposing the chip area.

The controller may control a size of the charged beam by controlling at least either of the mask or of the lens, and set the exposure amount smaller when exposing the peripheral area, than the exposure amount when exposing the chip area, by expanding the size of the charged beam.

The controller may irradiate the charged beam onto the wafer after a wait time for stabilizing a state of the lens has lapsed, for retaining predetermined accuracy of the irradiation position of the charged beam.

A wait time for stabilizing the state of the lens when exposing the peripheral area may be shorter than a wait time for stabilizing the state of the lens when exposing the chip area.

The controller may scan the peripheral area while irradiating the charged beam onto the peripheral area by controlling the lens.

By doing this, the wait time for the state of the lens to be stable when exposing the peripheral area can substantially be zero, after the irradiation of the charged beam begins.

The particle source may output an electron beam as the charged beam.

According to the second aspect of the present invention, there is provided a charged beam drawing method comprising:

arranging, in a predetermined position, a wafer having a surface on which a to-be-exposed resist is applied; and exposing the resist with predetermined accuracy of an irradiation position and at a predetermined exposure amount by irradiating the charged beam onto the wafer, wherein the exposing includes irradiating the charged beam onto a peripheral area of the wafer while setting accuracy of an irradiation position of the charged beam lower when exposing the peripheral area which is positioned at the periphery of a chip area including to-be-manufactured device chips and in which incomplete peripheral chips not to be manufactured are formed, than accuracy of an irradiation position of the charged beam when exposing the chip area of the wafer.

According to the present invention, the shorter exposure time can be realized by lowering the accuracy of the irradiation position of the charged beam in the peripheral area.

The irradiating the charged beam may include irradiating the charged beam onto the peripheral area while setting the exposure amount smaller when exposing the peripheral area, than the exposure amount when exposing the chip area.

The irradiating the charged beam may include controlling a size of the charged beam; and setting an exposure amount smaller when exposing the peripheral area than an exposure amount when exposing the chip area, by expanding a size of the charged beam.

The irradiating the charged beam may include irradiating the charged beam onto the wafer after a wait time for an irradiation position of the charged beam to be stable has lapsed, for retaining predetermined accuracy of the irradiation position.

A wait time for stabilizing the irradiation position of the charged beam when exposing the peripheral area may be shorter than a wait time for stabilizing the irradiation position of the charged beam when exposing the chip area.

The irradiating the charged beam may include scanning the peripheral area while irradiating the charged beam onto the peripheral area.

The resist which is formed at least in the peripheral area may be of a negative type.

The exposing may include irradiating the charged beam onto an area extending in a predetermined width from an end portion of the chip area, within the peripheral area.

The irradiating the charged beam may include irradiating an electron beam as the charged beam.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

An electron beam drawing apparatus according to the first embodiment of the present invention will now be described with reference to the accompanying drawings.

Figure 1:
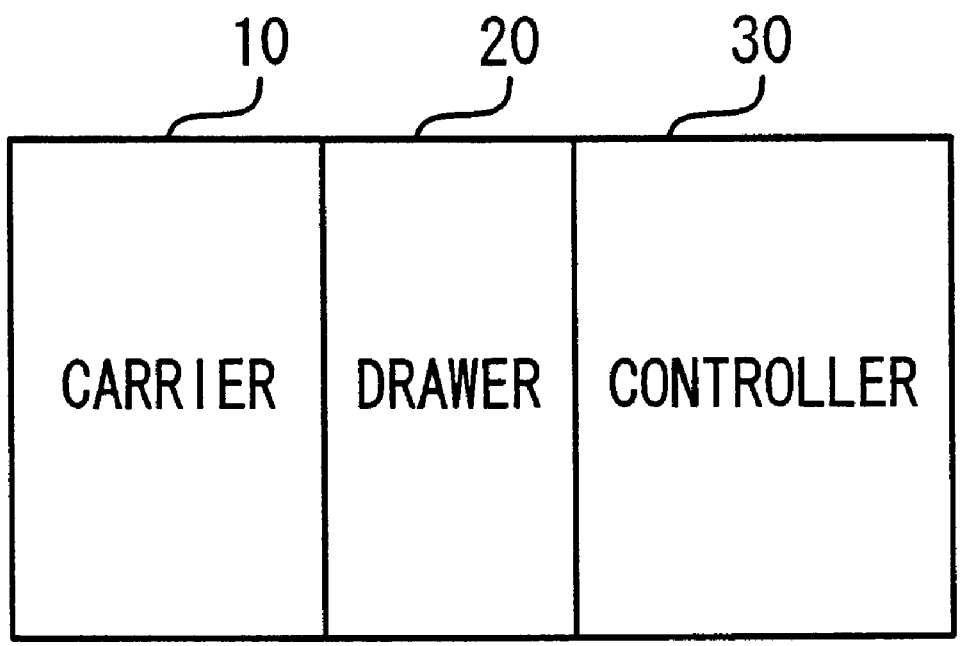
FIG. 1 is a structural diagram showing an electron beam drawing apparatus according to the first embodiment of the present invention.

FIG. 1 is a structural diagram showing an electron beam drawing apparatus according to the first embodiment of the present invention.

As shown in FIG. 1, the electron beam comprises a carrier 10, a drawer 20, and a controller 30.

The carrier 10 includes an arm having an absorption plate so as to load the wafer, with a surface on which a resist is applied, into the drawer 20. The carrier unloads the wafer from the drawer 20.

The drawer 20 exposes the resist on the wafer by irradiating an electron beam onto the wafer.

The controller 30 comprises a computer, etc., and controls operations of the drawer 20 based on data which is provided from a recording medium or data which is transmitted via a network.

Figure 2:
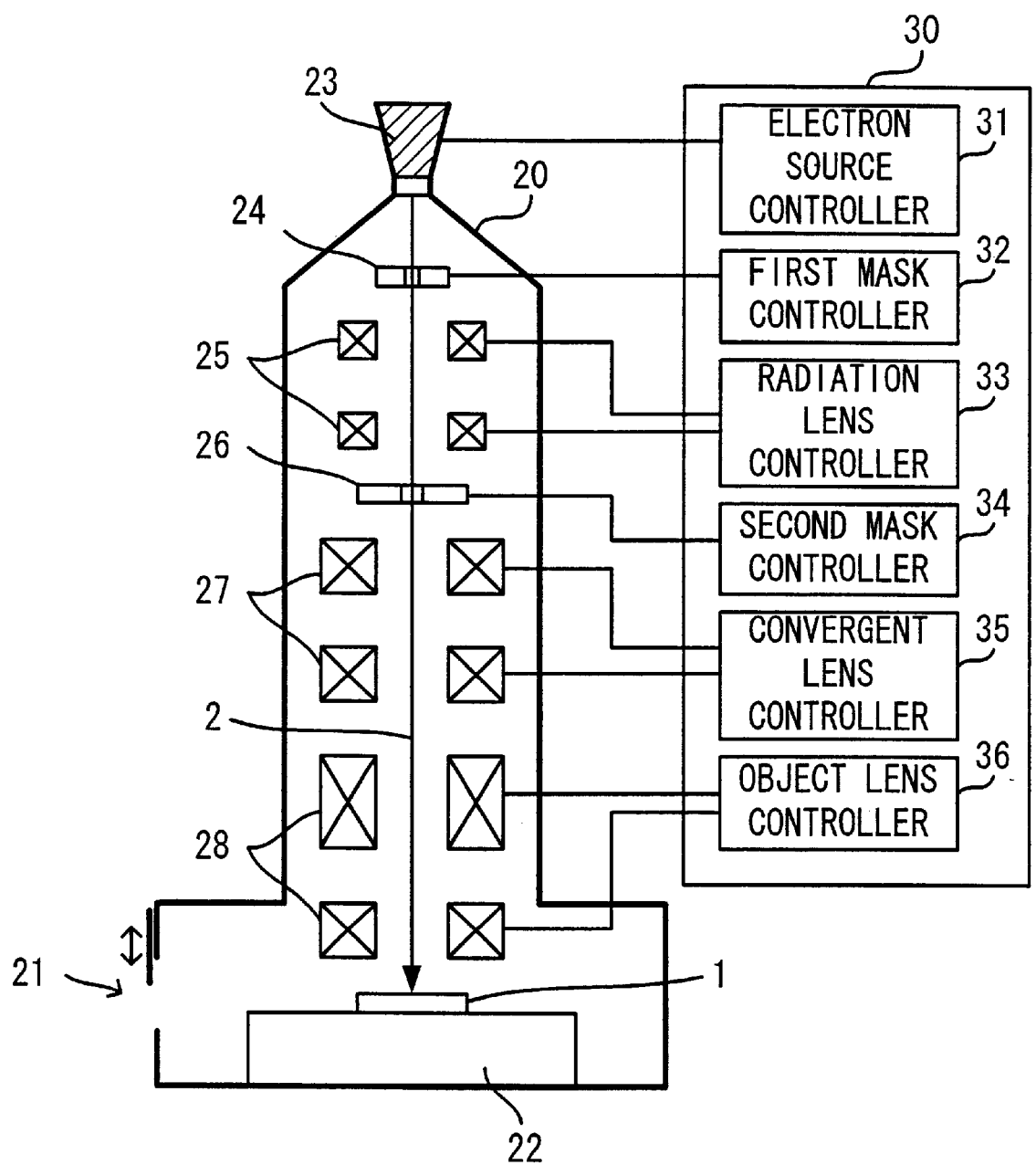
FIG. 2 is a structural diagram showing a drawer and a controller which are shown in FIG. 1.

FIG. 2 is a structural diagram showing the drawer 20 and the controller 30.

As shown in FIG. 2, the drawer 20 comprises a carry gate 21, a stage 22, an electron source 23, a first mask 24, radiation lenses 25, a second mask 26, convergent lenses 27, and object lenses 28.

The carry gate 21 is a gateway for carrying in and out a wafer 1.

The stage 22 is a stage on which the wafer 1 is placed.

The electron source 23 includes a thermal cathode or a cool cathode, and emits an electron beam 2.

The first mask 24 is a metal plate having an aperture through which the electron beam 2 passes, and limits an amount of electrons from the electron source 23.

The radiation lenses 25 are polarizers each including a polarizing coil, etc, and change a forward direction of the electrons which have passed through the first mask 24.

The second mask 26 is a metal plate having an aperture through which the electron beam 2 passes, and limits an amount of electrons in the forward direction which has been changed by the radiation lenses 25. The size of the aperture of the second mask 26 is equal to or smaller than that of the aperture of the first mask 24.

The convergent lenses 27 are convergent devices each including an electromagnet, etc., and change a degree of convergence of the electron beam 2 passed through the second mask 26.

Each of the object lenses 28 comprises an electromagnet, etc., and converges the electron beam 2.

The controller 30 has a plurality of functions as shown in FIG. 2. Specifically, the controller 30 functions as an electron source controller 31, a first mask controller 32, a radiation lens controller 33, a second mask controller 34, a convergent lens controller 35, and an object lens controller 36.

The controller 30 as the electron source controller 31 emits the electron beam 2 by supplying a voltage to an electrode of the electron source 23.

The controller 30 as the first mask controller 32 controls the amount of electrons which pass the first mask 24 by changing the position of the first mask 24, for example, at each draw.

The controller 30 as the radiation lens controller 33 changes a forward direction of the electrons passed through the first mask 24, for example, by changing the size of a current which flows to the radiation lenses 25.

The controller 30 as the second mask controller 34 controls the amount of the electrons passing the second mask 26 by changing the position of the second mask 26, for example, at each manufacturing lot. That is, the amount of the electrons irradiated onto the wafer 1 is controlled in accordance with a relative position of the first mask 24 and the second mask 26.

Figure 3:
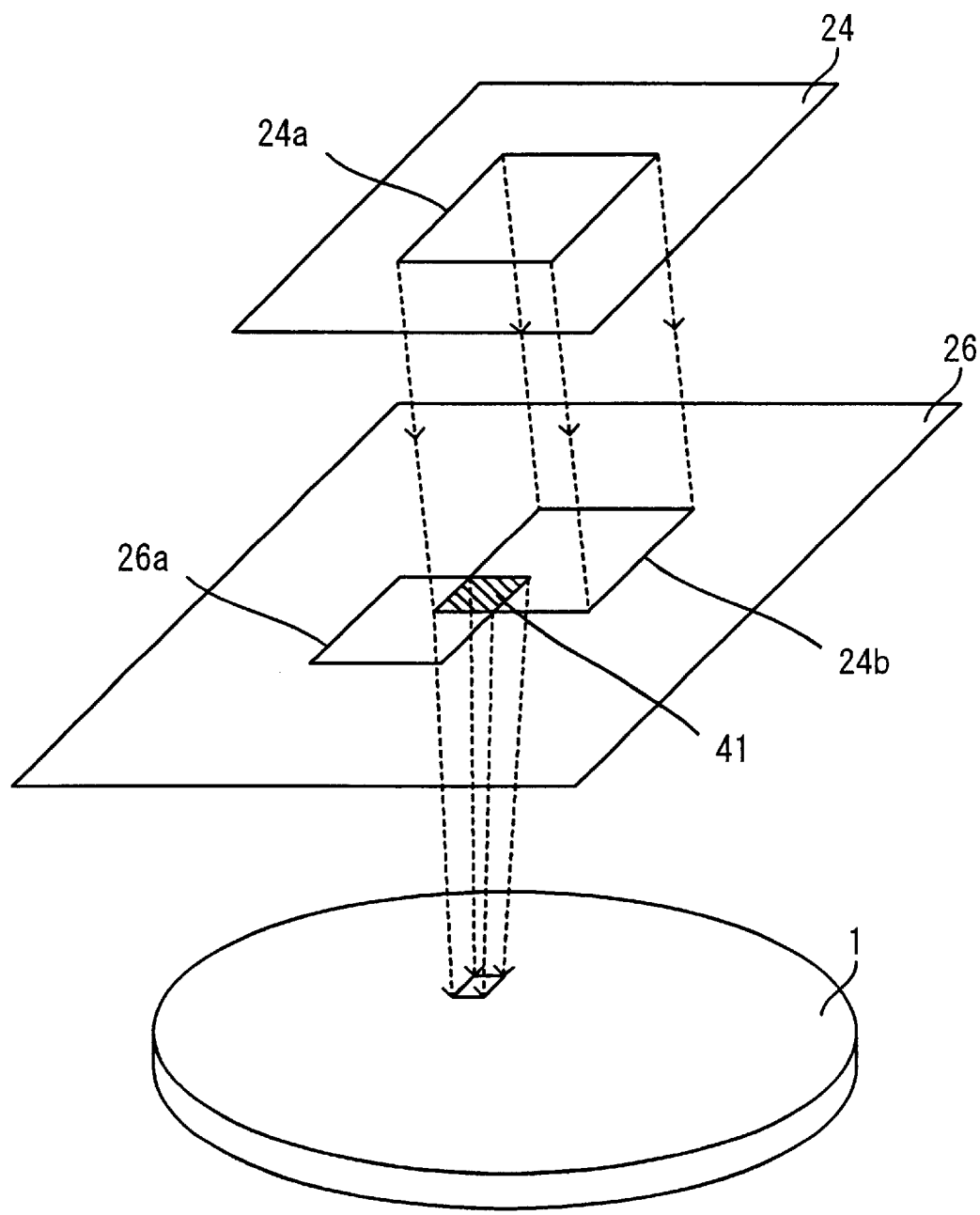
FIG. 3 is a schematic diagram showing a relative position of the first mask and the second mask and showing an amount of electrons irradiated on a wafer.

FIG. 3 is a schematic diagram showing a positional relationship between the first mask 24 and the second mask 26 and showing the amount of electrons irradiated onto the wafer 1.

As shown in FIG. 3, the electrons which have passed through an aperture 24a of the first mask 24 reach the second mask 26. The electrons which have reached the second mask 26 and further reached an aperture 26a of the second mask 26 pass through the second mask 26. In other words, only electrons, which have reached an area 41 where an area 24b of the second mask 26 reached by the electrons overlaps with the aperture 26a, are irradiated onto the wafer 1. In FIG. 3, a shaded portion with straight lines represents the area 41.

Accordingly, the controller 30 can easily control the amount of the electrons irradiated onto the wafer 1, by controlling the relative position of the first mask 24 and the second mask 26. The maximum size of the area 41 coincides with the size of the aperture 26a.

Furthermore, the controller 30 controls a rectangular form of the electron beam 2 by controlling the relative position of the first mask 24 and the second mask 26.

The controller 30 as the convergent lens controller 35 controls convergence of the electron beam 2 by changing, for example, the size of the current which flows to the convergent lenses 27.

The controller 30 as the object lens controller 36 converges the electron beam 2 by controlling, for example, the size of the current which flows to the object lenses 28.

The controller 30 changes the size of the electron beam 2 by controlling the first mask 24, the second mask 26, and the convergent lenses 27, etc. The controller 30 controls the width of the area onto which the electrons are irradiated, by changing the size of the electron beam 2 and scanning the area. More specifically, in a case where the width of the irradiation area of the electrons is controlled in three widths, for example, the controller 30 changes the size of the electron beam 2 into three sizes in association with the widths of the irradiation areas for scanning the irradiation area.

Figure 4:
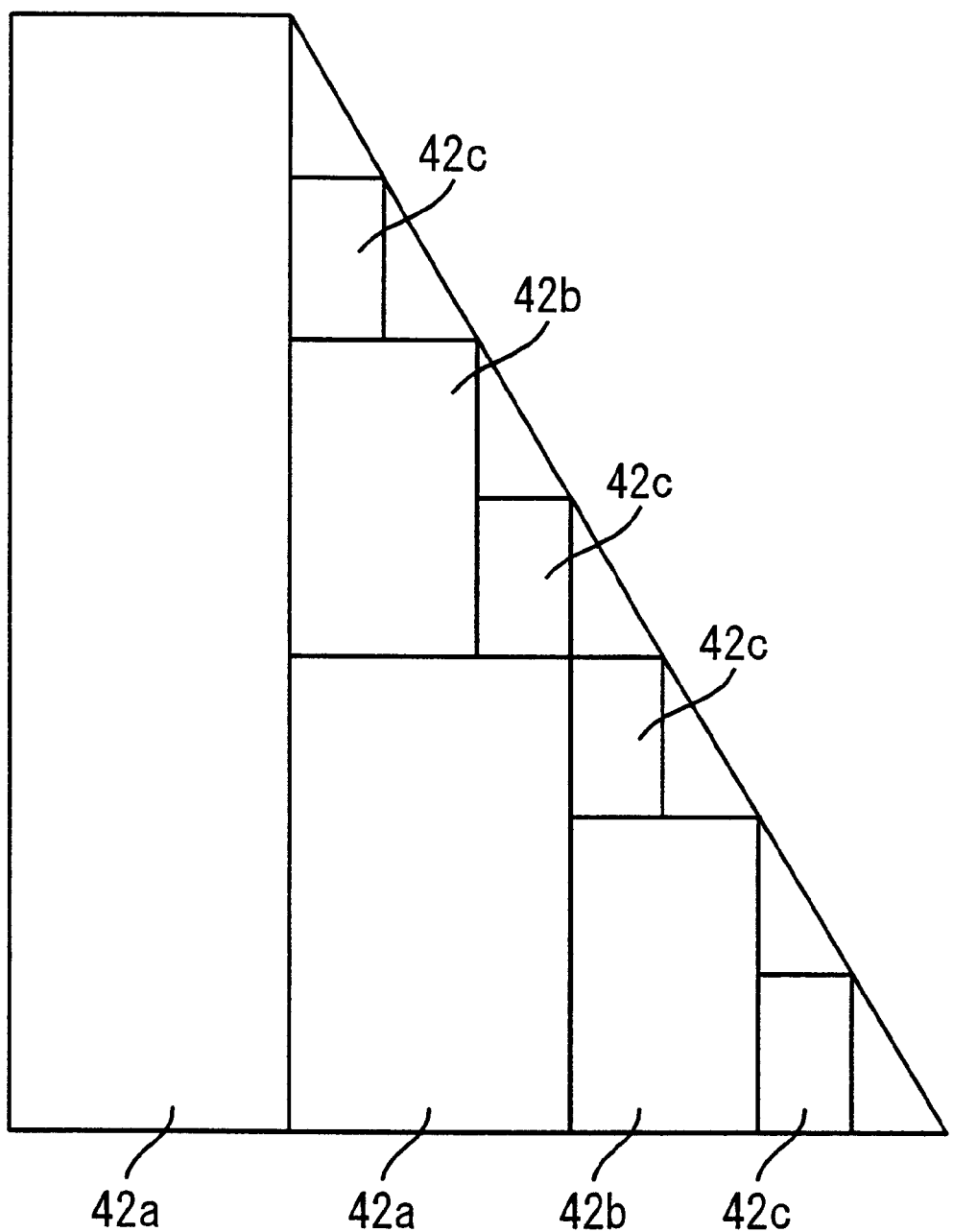
FIG. 4 is a diagram showing irradiation areas which are exposed when changing the size of an electron beam.

For example, in a case of exposing a drawing area in a trapezoid form shown in FIG. 4, the controller 30 first exposes a maximum wide area 42a shown in FIG. 4, by scanning the drawing area with the electron beam 2 which is large in size. Now, the controller 30 reduces the size of the electron beam 2 and scans the medium wide area 42b, so as to expose a medium wide area 42b shown in FIG. 4. The controller 30 further reduces the size of the electron beam 2 and scans the small wide area 42c, so as to expose a small wide area 42c shown in FIG. 4. Accordingly, the controller 30 can expose areas in a variety of forms by reducing the size of the electron beam 2 over and over.

Operations of the electron beam drawing apparatus having the above-described structure will now be described. The surface of the wafer 1 onto which the electron beam drawing apparatus irradiates the electron beam 2 is formed as shown in FIG. 5.

Figure 5:
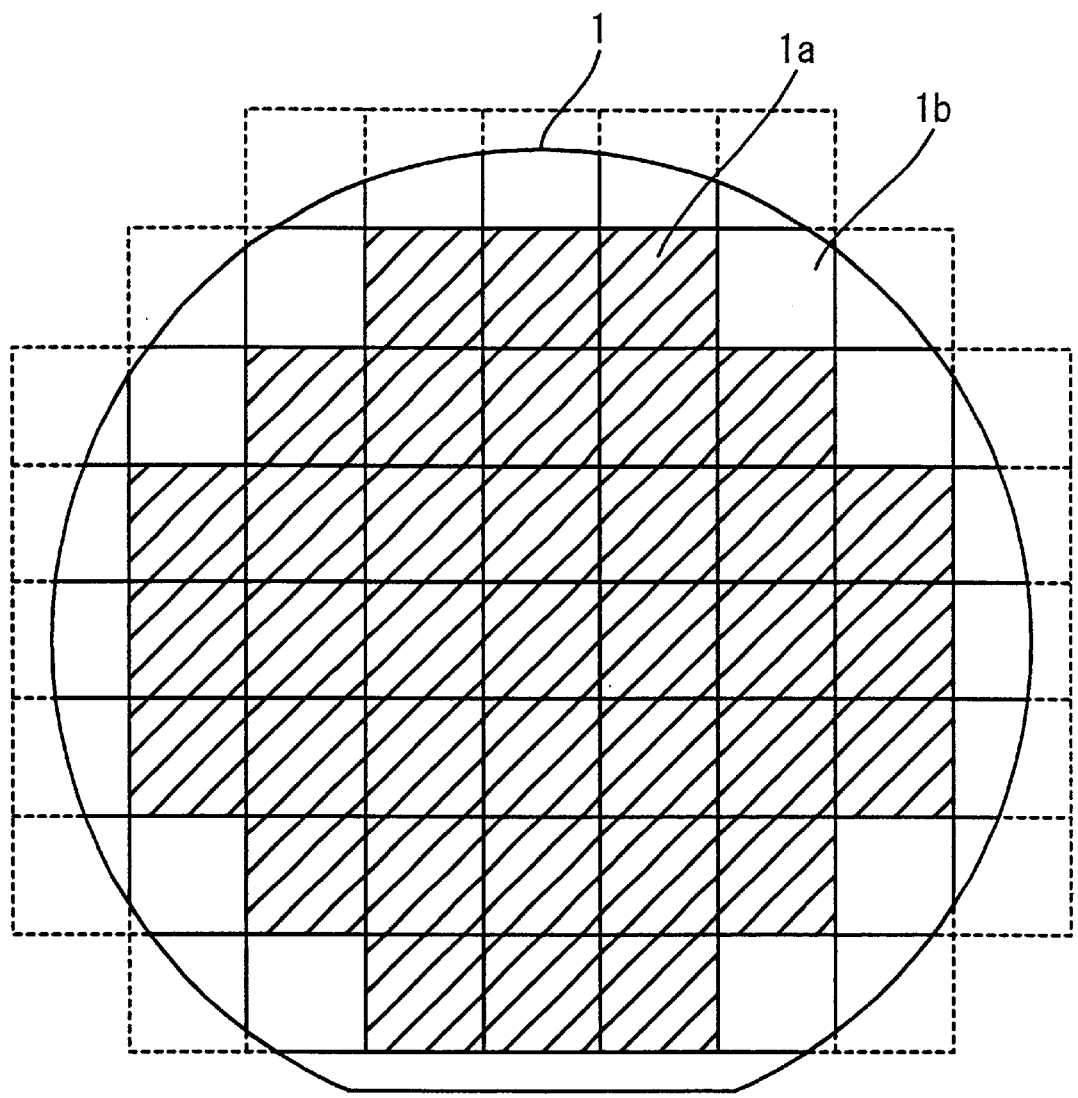
FIG. 5 is a diagram showing a chip area of a wafer surface in which chips to be manufactured as a wafer surface are formed and a peripheral area of the wafer surface in which incomplete chips not to be manufactured are formed.

As illustrated in FIG. 5, the wafer 1 includes an area (chip area 1a) in which to-be-manufactured chips (device chips) are formed and an area (peripheral area 1b) in which incomplete chips (peripheral chips) not to be manufactured are formed. In FIG. 5, a shaded portion with straight lines represents the chip area 1a.

Figure 6:
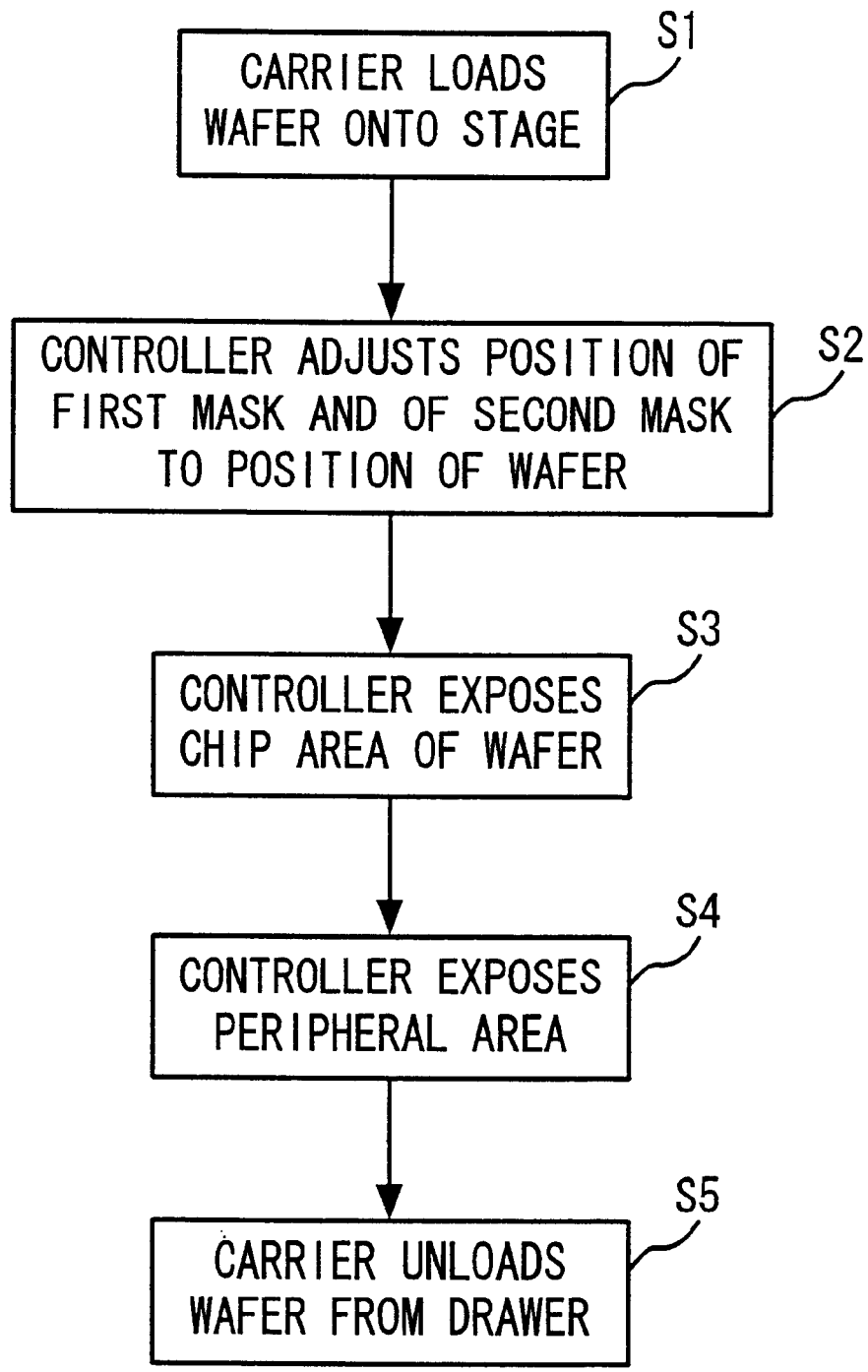
FIG. 6 is a flowchart showing operations of the electron beam drawing apparatus shown in FIG. 1.

FIG. 6 is a flowchart for explaining operations of the electron beam drawing apparatus when the apparatus exposes a piece of wafer 1.

First, the carrier 10 loads, into the drawer 20, the wafer 1 having a surface on which a resist is applied, and place the wafer 1 on the stage 22 (Step S1). Either of negative or positive type resist may be used in accordance with its purpose.

The controller 30 adjusts the position of the wafer 1 and the position of the first mask 24 and of the second mask 26 (Step S2).

Sequentially, the controller 30 exposes in a manner described below the chip area 1a of the wafer 1, by controlling the first mask 24, the radiation lenses 25, the second mask 26, the convergent lenses 27, and the object lenses 28 (Step S3).

Figure 7A:
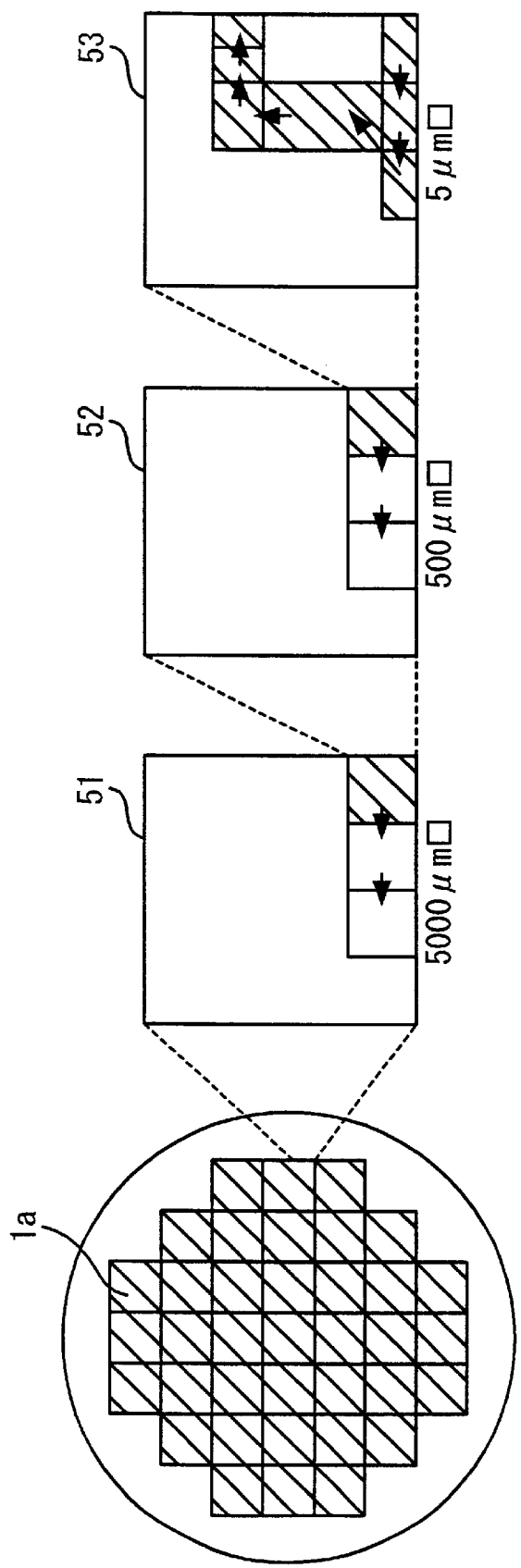
FIG. 7A is a diagram showing a procedure for exposing the chip area.

FIG. 7A is a diagram showing a procedure for exposing the chip area 1a. In FIG. 7A, shaded portions with straight lines represents irradiation areas of the electron beam 2.

As illustrated in FIG. 7A, a single device chip is divided into a plurality of main areas 51, for example. Each of the main areas 51 is divided into a plurality of sub areas 52, each of which is further divided into a plurality of sub—sub areas 53. The size of the main areas 51 is 5,000 $\mu$m in every side (5,000 $\mu$m□), and the size of the sub areas 52 is 500 $\mu$m in every side (500 $\mu$m□), whereas the size of the sub—sub areas 53 is 5 $\mu$m in every side (5 $\mu$m□), for example. The size of the sub—sub areas 53 coincides with that of the aperture 26a of the second mask 26.

The controller 30 first irradiates the electron beam 2 onto a corresponding one of the sub—sub areas 53. Specifically, the controller 30 controls the size of the irradiation area of the electron beam 2 by controlling the first mask 24 and the second mask 26, etc., and irradiates the electron beam 2 onto a predetermined area within the sub—sub area 53. The controller 30 shifts the irradiation position of the electron beam 2 by controlling the radiation lenses 25, the convergent lenses 27, and the object lenses 28. The controller 30 then irradiates the electron beam 2 onto the next predetermined area within the same sub—sub areas 53.

In repeating the above-described operations, the controller 30 exposes a single sub—sub area 53 as to describe a predetermined pattern (a pattern of an electrode or wiring for forming a device chip). On the chip area 1a, the electron beam 2 is irradiated as to draw the predetermined pattern of the electrode or the wiring, so that the controller 30 controls an emission position and exposure amount of the electron beam 2 in order to prevent the irradiation areas of the electron beam 2 from being overlapped with each other or deviated from their appropriate position at every shot. Because the wiring or the electrode has various widths, it is impossible to expose the sub—sub area 53 as to draw the pattern of the wiring or the electrode, etc, at one shot. Specifically, the controller 30 is to change the size of the electron beam 2 every time the wiring or the electrode varies in its width, for example, by controlling the first mask 24, the second mask 26, the radiation lenses 25, the convergent lenses 27, and the object lenses 28.

After the controller 30 exposes the single sub—sub area 53, it irradiates the electron beam 2 onto the following sub—sub area 53 within the same sub area 52 in a predetermined pattern.

Similarly, after the entire sub—sub areas 53 within the single sub area 52 are exposed, the controller 30 irradiates the electron beam 2 onto the following sub area 52 within one single main area 51 according to the above-described procedure.

After the entire sub areas 52 within the single main area 51 are exposed, the controller 30 irradiates the electron beam 2 onto the following main area 51 as described above.

In the above-described manner, the controller 30 exposes the main areas 51 in the chip area 1a in sequential order.

Accordingly, after the chip area 1a is exposed thereby, the controller 30 controls the first mask 24, the radiation lenses 25, the second mask 26, the convergent lenses 27, and the object lenses 28, and irradiates the electron beam 2 onto the peripheral area 1b in a manner described below (Step S4).

Since the controller 30 irradiates the electron beam 2 onto the chip area 1a as to write the pattern of the wiring or the electrode as described above, it is necessary to control the emission position and the exposure amount of the electron beam 2 with a high degree of accuracy. The peripheral area 1b is exposed with the object of protecting a wall of the resist formed in the chip area 1a. Thus, in the peripheral area 1b, it is not required to control, with the high degree of accuracy, the emission position and exposure amount of the electron beam 2. More specifically, the exposure amount may be set at a minimum amount at which the resist can still be exposed, and the irradiation areas of the electron beam 2 may be controlled not to invade the chip area 1a.

Figure 7B:
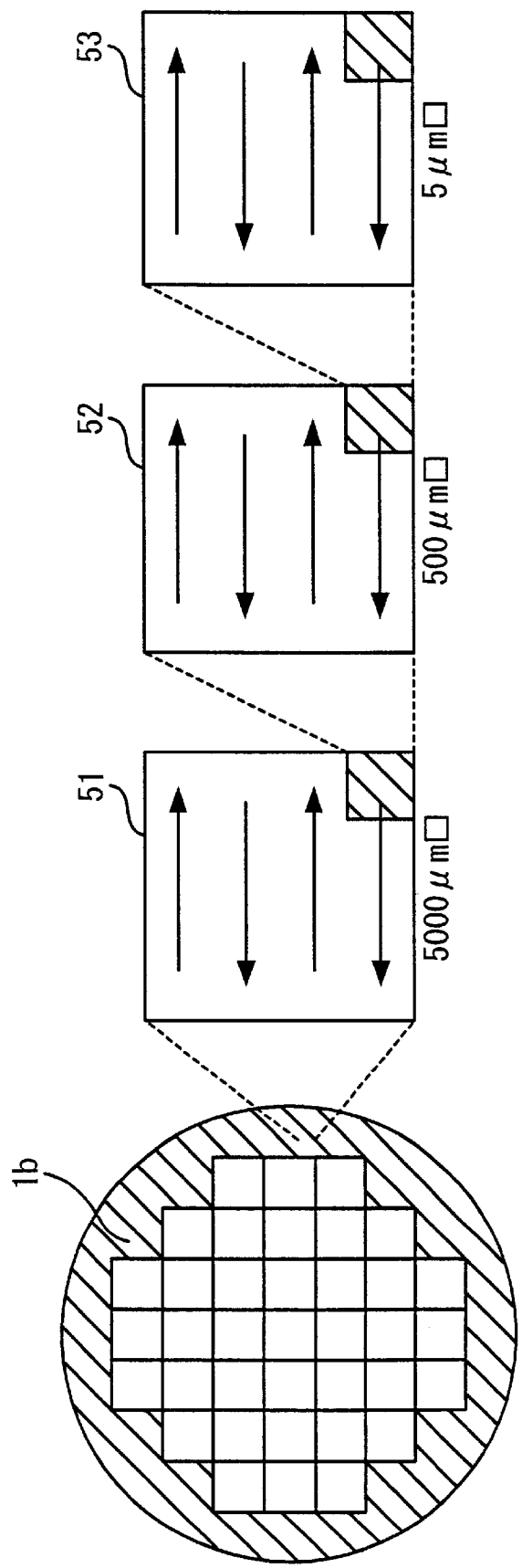
FIG. 7B is a diagram showing a procedure for exposing the peripheral area.

FIG. 7B is a diagram showing a procedure for exposing the peripheral area 1b. In FIG. 7B, shaded areas with straight lines represent irradiation areas of the electron beam 2.

As shown in FIG. 7B, when exposing the peripheral area 1b as well, the area is divided into a plurality of areas, such as main areas 51, sub areas 52, and sub—sub areas 53.

The controller 30 first irradiates the electron beam 2 onto a corresponding one of the sub—sub areas 53. Since the peripheral area 1b does not include any wiring or electrode, the width of the irradiation area may be set constant, that is, the size of the electron beam 2 may remain constant. Thus, the controller 30 scans the sub—sub area 53 from the very end portion thereof as shown in FIG. 7B, while irradiating the electron beam 2 thereon. The scanning speed of the electron beam 2 is determined in accordance with the minimum exposure amount at which the resist is exposed and with the current density of the electron beam 2.

After the controller 30 exposes one single sub—sub area 53, it scans with the electron beam 2 the following sub—sub area 53 within the same sub area 52.

Hereafter, after the entire sub—sub areas 53 within the same sub area 52 are exposed as described above, the controller 30 irradiates the electron beam 2 onto the following sub area 52 within the same main area 51 in the above-described manner.

After the controller 30 exposes the entire sub areas 52 within the identical main area 51, it irradiates the electron beam 2 onto the following main area 51 according to the above-described manner.

Thereafter, the controller 30 exposes in sequential order the main areas 51 within the peripheral area 1b.

After the controller 30 exposes the peripheral area 1b, the carrier 10 unloads the wafer 1 from the drawer 20 (Step S5), thereby to complete the drawing process to be performed on the piece of wafer 1.

As described above, the accuracy of the irradiation position or the exposure amount may differ in the exposure of the chip area 1a and the peripheral area 1b, so as to hold down, to a minimum, a decline in throughput resulted from exposing the peripheral area 1b.

Specifically, the time required for exposing the above-described chip area 1a includes a time for actually exposing the area and a time for preparing the exposure. The preparation time mainly includes a time for waiting until a state of the radiation lenses 25, etc., for changing the forward direction of the electrons at every shot becomes stable.

Figure 8:
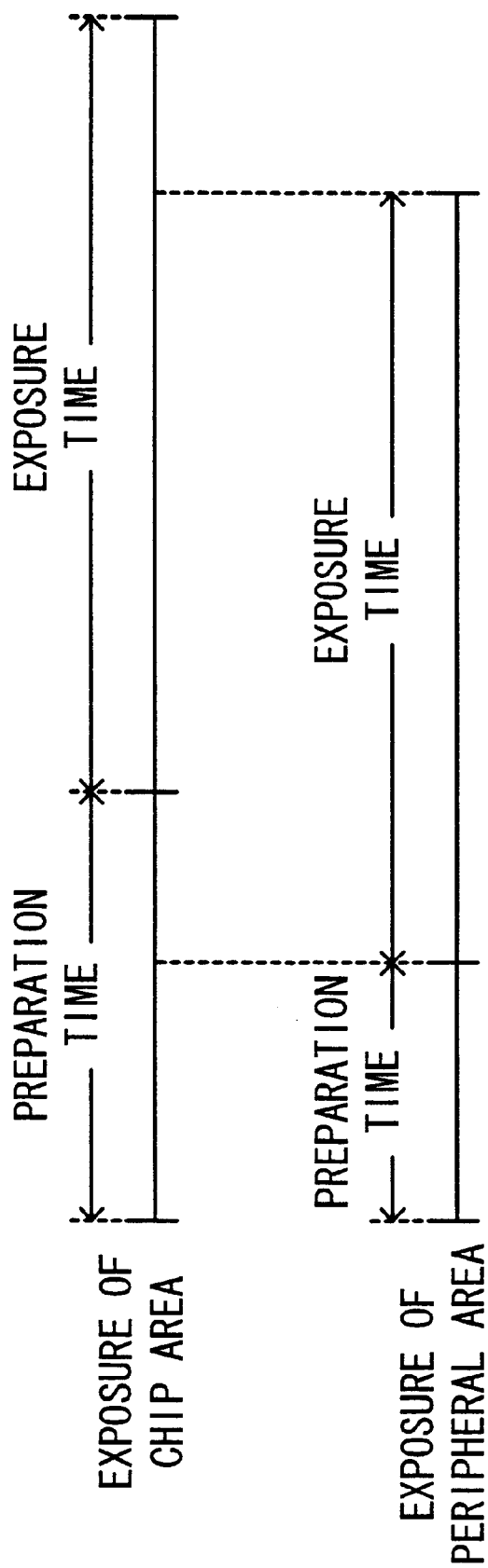
FIG. 8 is a diagram showing a comparison between preparation times necessary to expose the chip area and to expose the peripheral area.

In the exposure of the peripheral area 1b, as described above, the controller 30 controls the accuracy of the irradiation position and of the exposure amount, to its minimum degree indispensable for the exposure, and scans a predetermined area within the peripheral area 1b while irradiating the electron beam 2 thereon. Thus, there is no need to wait for the state in which the radiation lenses 25 become stable, and the short preparation time is needed for the exposure as shown in FIG. 8, that is, the time required for exposing the peripheral area 1b is short. The above-described preparation time includes a time for measuring a beam current for the purpose of improving the accuracy of the exposure amount and a time for correcting a proximity effect of the irradiation area.

In the exposure of the peripheral area 1b, the controller 30 may continuously expose the main areas 51, the sub areas 52, and the sub—sub areas 53 by scanning the peripheral area 1b while irradiating the electron beam 2 thereon. In doing this, the controller 30 may expose the peripheral area 1b at one shot, so that there is substantially no need to wait for stabilizing the state of the irradiation lenses 25, etc., after the exposure of the electron beam 2 begins.

Figure 10:
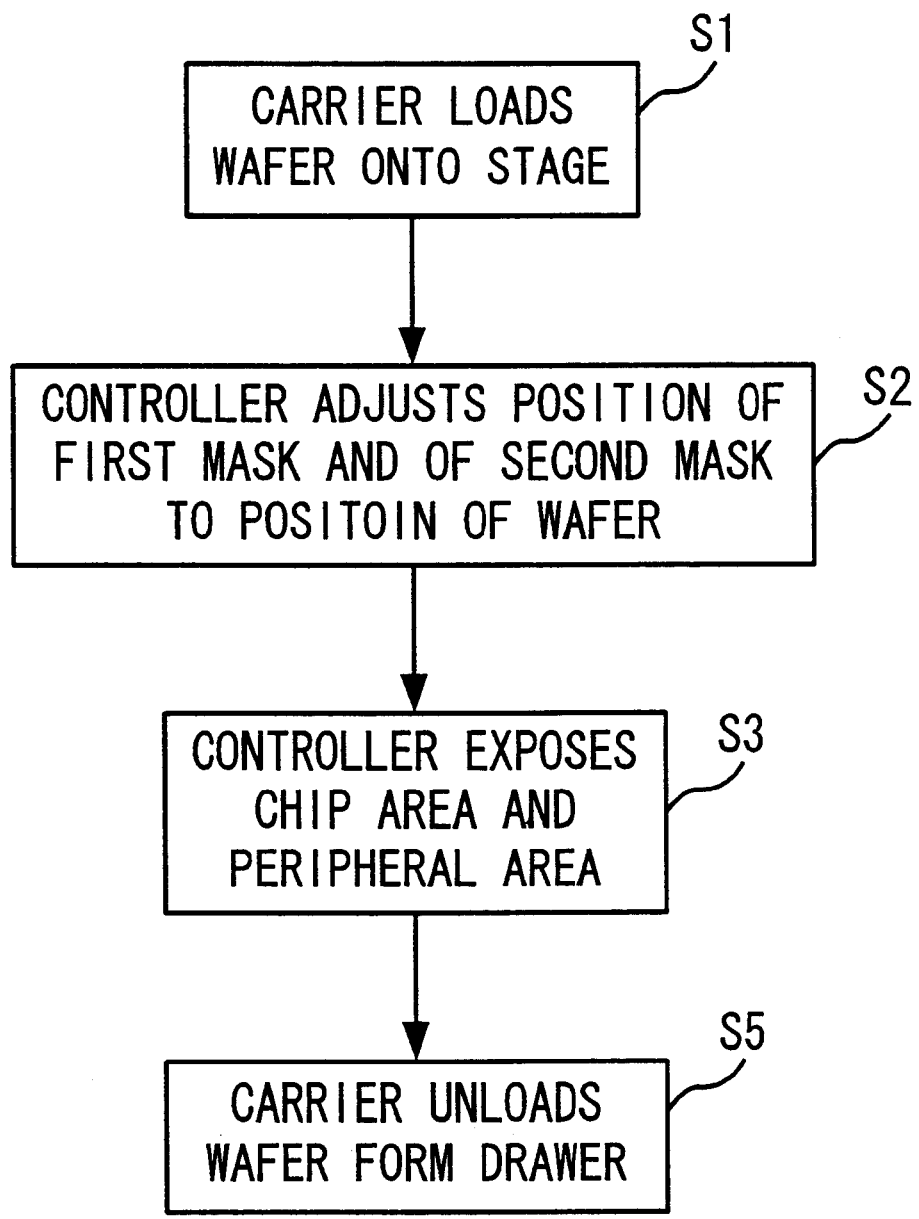
FIG. 10 is a flowchart showing operations of the electron beam drawing apparatus when exposing both of the chip area and the peripheral area with the same degree of accuracy.

Accordingly, the exposure time for exposing the chip area 1a and the peripheral area 1b may become shorter with different degrees of accuracy therebetween than the exposure time for exposing these areas at an identical degree of accuracy as shown in FIG. 10, without distinguishing the chip area 1a and the peripheral area 1b, for example.

The exposure amount in the peripheral area 1b is smaller than that in the chip area 1a, thus the consumption power required in the exposure becomes less than the conventional case.

In the exposure of the chip area 1a, the accuracy of the irradiation position of the electron beam 2 and of the exposure amount thereof are not limited, therefore, high yield of to-be-manufactured semiconductor devices can be realized.

An electron beam drawing apparatus according to the second embodiment of the present invention will now be described with reference to the accompanying drawings.

The structure of the electron beam drawing apparatus according to the second embodiment of the present invention is substantially identical with that shown in the first embodiment.

The method of exposing the chip area 1a is also substantially identical with the method shown in the first embodiment.

In the second embodiment, what is different from the first embodiment is the method of exposing the peripheral area 1b.

The controller 30 expands the size of the electron beam 2 to be irradiated onto the resist, by controlling the convergent lenses 27 and the object lenses 28, etc., when exposing the peripheral area 1b. That is, the controller 30 controls the convergent lenses 27 and the lenses 28 for achieving the size of the electron beam 2 to be the same as that of the sub—sub area 53, for example.

By controlling such lenses, the controller 30 may expose the sub—sub area 53 at one shot. Specifically, the controller 30 is not required to change the irradiation position of the electron beam 2 in the exposure of one single sub—sub area 53, therefore, the wait time for stabilizing the state of the radiation lenses 25, etc. substantially becomes zero.

After exposing the single sub—sub area 53, the controller 30 shifts the irradiation position of the electron beam 2 by controlling the radiation lenses 25, and exposes the following sub—sub area 53 within the same sub area 52 at one shot.

After exposing the entire sub—sub areas 53 within one single sub area 52, the controller 30 irradiates the electron beam 2 onto the following sub area 52 within the same main area 51 in the above-described manner.

After exposing the entire sub areas 52 within the same main area 51, the controller 30 irradiates the electron beam 2 onto the following main area 51 in the above-described manner.

Similarly, the controller 30 in sequential order expose the main areas 51 within the peripheral area 1b.

In expanding the size of the electron beam 2, the controller 30 exposes the single sub—sub area 53 at one shot, therefore, it is not needed to wait for the radiation lenses 25 to be stable when exposing the single sub—sub area 53, and the exposure time of the peripheral area 1b can be short. This permits high throughput of semiconductor devices to be manufactured.

In expanding the size of the electron beam 2, the exposure amount per unit area becomes small. As a result, the electric power consumed in the exposure becomes less than the conventional case.

In the exposure of the chip area 1a, high yield of to-be-manufactured semiconductor devices can be realized, because the radiation position and the exposure amount of the electron beam 2 are controlled at a high degree of accuracy.

Figure 9:
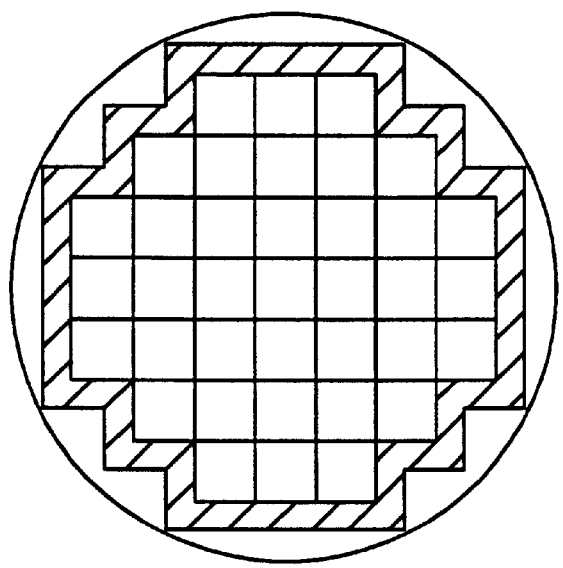
FIGS. 9A and 9B are diagrams each exemplifying an exposure area within the peripheral area.
Figure 9:
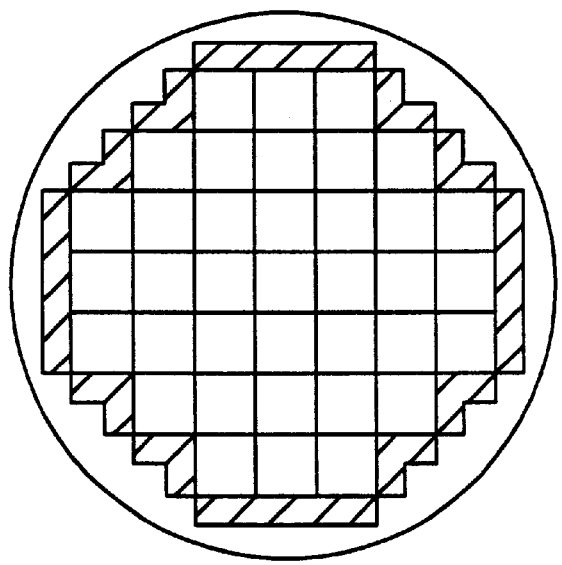

In the first embodiment of the present invention, as explained above, the peripheral area 1b is exposed with the object of protecting the side walls of the resist formed in the chip area 1a, thus, the entire part of the peripheral area 1b is not necessarily exposed. For example, as shown in FIG. 9A, an area in a given width (for example, 1 cm) at the periphery of the chip area 1a may be exposed. By so doing, only the small area may necessarily be exposed and the exposure time for exposing the piece of wafer 1 becomes short.

In the second embodiment as well, the peripheral area 1b is exposed with the object of protecting the side walls of the resist formed in the chip area 1a, thus, the entire part of the peripheral area 1b is not necessarily exposed as mentioned above. For example, as shown in FIG. 9B, only an area in a given width at the periphery of the chip area 1b can be exposed. Accordingly, only the small area may necessarily be exposed and the exposure time for exposing the piece of wafer 1 becomes short.

In the second embodiment, the controller 30 may further expands the size of the electron beam 2 to be irradiated onto the resist, by controlling the convergent lenses 27 and the object lenses 28, etc., when exposing the peripheral area 1b. For example, if the size of the electron beam 2 is adjusted to coincide with that of the sub area 52, the controller 30 may expose the sub area 52 at one shot. That is, when exposing the sub—sub areas 53 in the single sub area 52, the time for waiting the radiation lenses 25, etc. to be stable is not needed, thus the time for waiting the radiation lenses 25, etc. to be stable substantially becomes zero. If the size of the electron beam 2 is expanded as to coincide with the main area 51, the controller 30 can expose the main area 51 at one shot, therefore, the time for waiting the radiation lenses 25, etc., to be stable substantially becomes zero, when exposing the single main area 51.

If the size of the electron beam 2 is expanded as described above, the form of the electron beam 2 may be out of focus. However, expanding the size of the electron beam 2 should not lead to any serious problem, because it is performed while exposing the peripheral area 1b.

In the first and the second embodiments, how short the exposure time can be made will now be described.

The time (wafer draw time) required for exposing the piece of wafer 1 can generally be obtained in accordance with the following equation.

Wafer draw time=alignment time+actual draw time+$\alpha$(initial/complete processing time)

$\alpha$ is a time necessary for carrying in and out the wafer 1, for example.

The above-described actual draw time can generally be obtained in accordance with the following equation.

Actual draw time=number of chips×{$Nc$×($Tss+Dr/D$)+$Ts$×$Ns+Tm$×$Nm$} where Nc represents the number of shots per chip, Tss represents the time for waiting the radiation lenses 25, etc., to be stable when exposing the sub—sub area 53, Dr represents resist sensitivity, D represents the above-described current density, Ts represents the time for waiting the radiation lenses 25, etc., to be stable when exposing the sub area 52, Ns represents the number of the sub area 52 per chip, Tm represents the time for waiting the radiation lenses 25, etc., to be stable when exposing the main areas 51, and Nm represents the number of the main areas 51 per chip.

As a prerequisite, the size of each chip is 15 mm in every side (15 mm□), the number (Nc) of shots per chip is $1.12 \times 10^7$ shots, the resist sensitivity (Dr) is 5.0 $\mu C/cm^2$, the current density (D) is 10 $A/cm^2$. Further, the number of chips formed in the chip area 1a is fifty two, and the number of chips which increases when exposing the peripheral area 1b is twenty four.

As a result of an actual process for drawing the chip area 1a on the basis of the above-described prerequisite, the alignment time is 93 seconds, the actual drawing takes 772.7 seconds, α denotes 6.4 seconds, and the draw time (chip draw time) per wafer 1 is 872.1 seconds.

As a result of an actual process for drawing the peripheral area 1b on the basis of the above-described prerequisite, the actual draw time of the peripheral area 1b is as follows.

In a case where twenty four chips formed in the peripheral area 1b are exposed with the same degree of accuracy as those in the chip area 1a, the required time is identical with the time required for exposing 24 chips in the chip area 1a. Thus, the time required for drawing the peripheral area 1b becomes $772.7/52 \times 24=356.6$ (sec). This makes up approximately 40% of the above-described time required for drawing the chip area 1a.

As explained in the second embodiment, in expanding the size of the electron beam 2 up to the size of the main area 51, when the main area 51 is drawn, Tss, Ts, and Tm are all equal to zero. Therefore, the above-described actual draw time can be obtained in accordance with the following equation.

the number of chips×$Nc \times Dr/D$(=total number of shots×$Dr/D$)

Particularly, in a case where the peripheral part of the chip area 1a is exposed in the width of 1 cm, the area of the peripheral area 1b to be exposed is approximately 3,600 $mm^2$. Now, if the area to be exposed at one shot is assumed as 5 $\mu m \square$ (25 $\mu m^2$), the actual draw time in the peripheral area 1b can be obtained from the following equation.

the actual draw time=total number of shots×$Dr/D$

=3,600 $(mm^2)/25(\mu m^2) \times Dr/D$

=72 (sec)

The resultant calculation, that is, the actual draw time makes up only 8% of the above-described chip draw time.

As the result of the above, it is obviously indicated that drawing the piece of wafer 1 takes shorter time, when exposing the peripheral area 1b with the lower degree of accuracy than the degree of accuracy for exposing the chip area 1a, than the draw time when exposing the peripheral area 1b with the same degree of accuracy as the chip area 1b.

The peripheral area 1b may be exposed in combination of the methods shown in the first and the second embodiments. For example, the peripheral area 1b may be scanned with the electron beam 2 which has been expanded in its size.

Further, the resist on the wafer 1 may be exposed by a charged particle, such as an ion or the like, in stead of an electron. It should be understood that the resist which can be exposed by charged particles needs to be applied on the wafer 1 in advance.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H10-221659 filed on Aug. 5, 1998, and including specification, claims, drawings and summary. The disclosure of the above Japanese Patent Application is incorporated herein by reference in its entirety.

What is claimed is:

1. A charged beam drawing apparatus comprising:

a particle source which outputs a charged beam to be irradiated onto a wafer having a surface on which a to-be-exposed resist is applied;

predetermined number of masks each of which has an aperture through which the charged beam can pass;

at least one lens which changes a forward direction of the charged beam and changes a degree of convergence of the charged beam; and a controller which irradiates the charged beam onto the wafer with predetermined accuracy of an irradiation position and at a predetermined exposure amount, by controlling at least either of said particle source, said masks, or of said lens, and wherein said controller irradiates the charged beam onto a peripheral area of the wafer while setting the accuracy of the irradiation position of the charged beam lower when exposing the peripheral area, which is positioned at periphery of a chip area including to-be-manufactured device chips and in which incomplete peripheral chips not to be manufactured are formed, than the accuracy of the irradiation position of the charged beam when exposing the chip area of the wafer.

2. The charged beam drawing apparatus according to claim 1, wherein:

said controller irradiates the charged beam onto the wafer after a wait time for stabilizing a state of said lens has lapsed, for retaining predetermined accuracy of the irradiation position; and a wait time for stabilizing the state of said lens when exposing the peripheral area is shorter than a wait time for stabilizing the state of said lens when exposing the chip area.

3. The charged beam drawing apparatus according to claim 2, wherein said controller scans the peripheral area while irradiating the charged beam onto the peripheral area, by controlling said lens.

4. The charged beam drawing apparatus according to claim 3, wherein said particle source outputs an electron beam as the charged beam.

5. The charged beam drawing apparatus according to claim 1, wherein said controller irradiates the charged beam onto the peripheral area, by setting an exposure amount smaller when exposing the peripheral area than an exposure amount when exposing the chip area.

6. The charged beam drawing apparatus according to claim 5, wherein said controller controls a size of the charged beam by controlling at least either of said mask or of said lens, and sets the exposure amount smaller when exposing the peripheral area than the exposure amount when exposing the chip area, by expanding the size of the charged beam.

7. The charged beam drawing apparatus according to claim 5, wherein said controller irradiates the charged beam onto the wafer after a wait time for stabilizing the state of said lens has lapsed, for retaining the predetermined accuracy of the irradiation position; and a wait time for stabilizing the state of said lens when exposing the peripheral area is shorter than a wait time for stabilizing the state of said lens when exposing the chip area.

8. The charged beam drawing apparatus according to claim 7, wherein said controller scans the peripheral area while irradiating the charged beam onto the peripheral area, by controlling said lens.

9. The charged beam drawing apparatus according to claim 8, wherein said particle source outputs an electron beam as the charged beam.

10. A charged beam drawing method comprising:

arranging, in a predetermined position, a wafer having a surface on which a to-be-exposed resist is applied; and exposing the resist with predetermined accuracy of an irradiation position and at a predetermined exposure amount by irradiating the charged beam onto the wafer, and wherein said exposing includes irradiating the charged beam onto a peripheral area on the wafer while setting the accuracy of the irradiation position of the charged beam lower when exposing the peripheral area, which is positioned at periphery of a chip area including to-be-manufactured device chips and in which incomplete peripheral chips not to be manufactured are formed, than the accuracy of the irradiation position of the charged beam when exposing the chip area of the wafer.

11. The charged beam drawing method according to claim 10, wherein:

said exposing includes irradiating the charged beam onto the wafer after a wait time for stabilizing the irradiation position of the charged beam has lapsed, for retaining the predetermined accuracy of the irradiation position; and a wait time for the irradiation position to be stable when exposing the peripheral area is shorter than a wait time for the irradiation position to be stable when exposing the chip area.

12. The charged beam drawing method according to claim 11, wherein said exposing includes scanning the peripheral area while irradiating the charged beam onto the peripheral area.

13. The charged beam drawing method according to claim 12, wherein:

the resist formed at least in the peripheral area is of a negative type; and said exposing includes irradiating the charged beam onto an area extending in a predetermined width from the chip area, within the peripheral area.

14. The charged beam drawing method according to claim 13, wherein said exposing includes irradiating an electron beam as the charged beam.

15. The charged beam drawing method according to claim 10, wherein said exposing includes irradiating the charged beam onto the peripheral area while setting an exposure amount smaller when exposing the peripheral area than an exposure amount when exposing the chip area.

16. The charged beam drawing method according to claim 15, wherein said irradiating the charged beam includes controlling a size of the charged beam, and setting the exposure amount smaller when exposing the peripheral area than the exposure amount when exposing the chip area, by expanding a size of the charged beam.

17. The charged beam drawing method according to claim 15, wherein:

said irradiating the charged beam includes irradiating the charged beam onto the wafer after a wait time for stabilizing an irradiation position of the charged beam has lapsed, for retaining predetermined accuracy of the irradiation position.

18. The charged beam drawing method according to claim 17, wherein said irradiating the charged beam includes scanning the peripheral area while irradiating the charged beam onto the peripheral area.

19. The charged beam drawing method according to claim 18, wherein:

the resist which is formed at least in the peripheral area is of a negative type; and said exposing includes irradiating the charged beam onto an area extending in a predetermined width from an end portion of the chip area, within the peripheral area.

20. The charged beam drawing method according to claim 19, wherein said irradiating the charged beam includes irradiating an electron beam as the charged beam.

* * * * *